(12) United States Patent
Lei et al.

(10) Patent No.: US 9,969,622 B2
(45) Date of Patent: May 15, 2018

(54) TERNARY TUNGSTEN BORIDE NITRIDE FILMS AND METHODS FOR FORMING SAME

(71) Applicant: Lam Research Corporation, Fremont, CA (US)

(72) Inventors: Wei Lei, San Jose, CA (US); Juwen Gao, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days. days.

(21) Appl. No.: 13/949,092

(22) Filed: Jul. 23, 2013

(65) Prior Publication Data

US 2014/0027664 A1 Jan. 30, 2014

Related U.S. Application Data

(60) Provisional application No. 61/676,123, filed on Jul. 26, 2012, provisional application No. 61/697,775, filed on Sep. 6, 2012.

(51) Int. Cl.
C23C 16/30 (2006.01)
C01B 35/14 (2006.01)
(Continued)

(52) U.S. Cl.
CPC ............ *C01B 35/146* (2013.01); *C23C 16/30* (2013.01); *C23C 16/342* (2013.01);
(Continued)

(58) Field of Classification Search
None
See application file for complete search history.

(56) References Cited

U.S. PATENT DOCUMENTS 5,633,200 A 5/1997 Hu
5,916,634 A * 6/1999 Fleming et al. ....... 427/255.392
(Continued)

FOREIGN PATENT DOCUMENTS

CN 101899649 A 12/2010
CN 103125013 A 5/2013
(Continued)

OTHER PUBLICATIONS

U.S. Appl. No. 14/738,685, filed Jun. 12, 2015, entitled "Method for Producing Ultra-Thin Tungsten Layers With Improved Step Coverage."

(Continued)

*Primary Examiner* — Mandy Louie
(74) *Attorney, Agent, or Firm* — Weaver Austin Villeneuve & Sampson LLP

(57) ABSTRACT

Ternary tungsten boride nitride (WBN) thin films and related methods of formation are provided. The films are have excellent thermal stability, tunable resistivity and good adhesion to oxides. Methods of forming the films can involve thermal atomic layer deposition (ALD) processes in which boron-containing, nitrogen-containing and tungsten-containing reactants are sequentially pulsed into a reaction chamber to deposit the WBN films. In some embodiments, the processes include multiple cycles of boron-containing, nitrogen-containing and tungsten-containing reactant pulses, with each cycle including multiple boron-containing pulses.

15 Claims, 11 Drawing Sheets

(51) Int. Cl.

| | |
|---|---|
| *C23C 16/34* | (2006.01) |
| *H01L 23/522* | (2006.01) |
| *H01L 23/532* | (2006.01) |
| *H01L 45/00* | (2006.01) |
| *C23C 16/455* | (2006.01) |
| *H01L 21/285* | (2006.01) |
| *H01L 21/768* | (2006.01) |

(52) U.S. Cl.
CPC .. *C23C 16/45531* (2013.01); *H01L 21/28562* (2013.01); *H01L 21/76843* (2013.01); *H01L 21/76876* (2013.01); *H01L 23/5226* (2013.01); *H01L 23/53266* (2013.01); *H01L 45/06* (2013.01); *H01L 45/126* (2013.01); *H01L 45/16* (2013.01); *H01L 2924/0002* (2013.01)

(56) References Cited

U.S. PATENT DOCUMENTS

| | | | | |
|---|---|---|---|---|
| 6,284,316 | B1 | 9/2001 | Sandhu et al. | |
| 6,287,965 | B1* | 9/2001 | Kang et al. | 438/648 |
| 6,340,629 | B1 | 1/2002 | Yeo et al. | |
| 6,491,978 | B1 | 12/2002 | Kalyanam | |
| 8,993,055 | B2 | 3/2015 | Rahtu et al. | |
| 9,034,760 | B2 | 5/2015 | Chen et al. | |
| 9,076,843 | B2 | 7/2015 | Lee et al. | |
| 9,153,486 | B2 | 10/2015 | Arghavani et al. | |
| 9,159,571 | B2 | 10/2015 | Humayun et al. | |
| 9,236,297 | B2 | 1/2016 | Chen et al. | |
| 9,240,347 | B2 | 1/2016 | Chandrashekar et al. | |
| 2001/0007797 | A1* | 7/2001 | Jang et al. | 438/761 |
| 2002/0090811 | A1 | 7/2002 | Kim et al. | |
| 2002/0190379 | A1 | 12/2002 | Jian et al. | |
| 2003/0013300 | A1 | 1/2003 | Byun | |
| 2003/0082902 | A1 | 5/2003 | Fukui et al. | |
| 2003/0194850 | A1 | 10/2003 | Lewis et al. | |
| 2003/0224217 | A1 | 12/2003 | Byun et al. | |
| 2008/0081452 | A1 | 4/2008 | Kim et al. | |
| 2008/0124926 | A1* | 5/2008 | Chan et al. | 438/685 |
| 2008/0283844 | A1 | 11/2008 | Hoshi et al. | |
| 2009/0050937 | A1 | 2/2009 | Murata et al. | |
| 2009/0142509 | A1* | 6/2009 | Yamamoto | C23C 14/0021 427/527 |
| 2010/0007797 | A1 | 1/2010 | Stojancic | |
| 2010/0062149 | A1* | 3/2010 | Ma et al. | 427/126.1 |
| 2010/0072623 | A1 | 3/2010 | Prindle et al. | |
| 2010/0244260 | A1* | 9/2010 | Hinomura | H01L 21/76846 257/751 |
| 2011/0151670 | A1 | 6/2011 | Lee et al. | |
| 2012/0077342 | A1 | 3/2012 | Gao et al. | |
| 2012/0225192 | A1* | 9/2012 | Yudovsky et al. | 427/58 |
| 2014/0061784 | A1 | 3/2014 | Kang | |
| 2014/0319614 | A1 | 10/2014 | Paul et al. | |
| 2015/0037972 | A1 | 2/2015 | Danek et al. | |
| 2015/0179461 | A1 | 6/2015 | Bamnolker et al. | |
| 2015/0279732 | A1 | 10/2015 | Lee et al. | |
| 2016/0118345 | A1 | 4/2016 | Chen et al. | |
| 2016/0190008 | A1 | 6/2016 | Chandrashekar et al. | |
| 2016/0233220 | A1 | 8/2016 | Danek et al. | |
| 2016/0351401 | A1 | 12/2016 | Ba et al. | |
| 2016/0351444 | A1 | 12/2016 | Schloss et al. | |

FOREIGN PATENT DOCUMENTS

| | | |
|---|---|---|
| JP | S5629648 A | 3/1981 |
| JP | 2003-193233 | 7/2003 |

OTHER PUBLICATIONS

U.S. Appl. No. 14/723,270, filed May 27, 2015, entitled "Deposition of Low Fluorine Tungsten by Sequential CVD Process."
U.S. Notice of Allowance, dated Jun. 17, 2015, issued in U.S. Appl. No. 13/862,048.
U.S. Office Action, dated May 6, 2015, issued in U.S. Appl. No. 14/135,375.
U.S. Final Office Action, dated Sep. 29, 2015, issued in U.S. Appl. No. 14/135,375.
U.S. Notice of Allowance, dated Jun. 2, 2015, issued in U.S. Appl. No. 14/173,733.
U.S. Final Office Action, dated Jun. 2, 2015, issued in U.S. Appl. No. 14/097,160.
U.S. Notice of Allowance, dated Sep. 9, 2015, issued in U.S. Appl. No. 14/097,160.
U.S. Final Office Action, dated Jul. 17, 2015, issued in U.S. Appl. No. 14/502,817.
U.S. Notice of Allowance, dated Sep. 25, 2015, issued in U.S. Appl. No. 14/502,817.
Chinese Fifth Office Action dated May 5, 2015 issued in Application No. 200980133560.1.
Taiwan Office Action dated Jun. 8, 2015 issued in TW 099107504.
Korean First Office Action dated Jul. 10, 2015 issued in KR Application No. 10-2014-0090283.
Taiwan Office Action dated Aug. 4, 2015 issued in TW Application No. 099111859.
Chinese Office Action [no translation] dated Sep. 6, 2015 issued in CN 201310320848.8.
U.S. Appl. No. 15/040,561, filed Feb. 10, 2016, entitled "Tungsten for Wordline Applications."
U.S. Appl. No. 14/723,275, filed May 27, 2015, entitled "Tungsten Films Having Low Fluorine Content."
U.S. Office Action, dated Jan. 12, 2016, issued in U.S. Appl. No. 14/738,685.
U.S. Office Action, dated Jan. 21, 2016, issued in U.S. Appl. No. 14/135,375.
U.S. Office Action, dated Feb. 1, 2016, issued in U.S. Appl. No. 14/723,275.
U.S. Office Action, dated Oct. 8, 2015, issued in U.S. Appl. No. 13/774,350.
Taiwan Office Action (Rejection Decision) dated Oct. 28, 2015 issued in Application No. TW 099130354.
Chinese Office Action [no translation] dated Feb. 26, 2016, issued in CN 201380022648.2.
Chinese First Office Action dated Mar. 18, 2016 issued in Application No. CN 201380022693.8.
Chinese First Office Action dated Sep. 6, 2015 issued in Application No. CN 201310320848.8.
Chinese Second Office Action dated May 16, 2016 issued in Application No. CN 201310320848.8.
Taiwan Examination Report dated Oct. 26, 2016 issued in Application No. TW 102126696.

\* cited by examiner

US 9,969,622 B2

TERNARY TUNGSTEN BORIDE NITRIDE FILMS AND METHODS FOR FORMING SAME

CROSS-REFERENCE TO RELATED CASES

This application claims benefit under 35 USC § 119(e) of the following applications: U.S. Provisional Patent Application No. 61/676,123, filed Jul. 26, 2012 and U.S. Provisional Patent Application No. 61/697,775, filed Sep. 6, 2012. Both of these applications are incorporated herein by reference in their entireties.

BACKGROUND

Resistivity is an intrinsic property of a material and a measurement of a material's resistance to the movement of charge through the material. High or low resistivity materials can be used for different applications. For example, low resistivity metal layers in integrated circuits minimize power losses. High resistivity metal layers may be used as heater elements for phase change memory or other applications.

In one example, tungsten layers may be used as low resistivity electrical connections in the form of horizontal interconnects, vias between adjacent metal layers, and contacts between a first metal layer and the devices on the silicon substrate. Tungsten nitride layers may be used as diffusion barriers for tungsten interconnects, vias and plugs, providing relatively low resistivity and good adhesion to dielectric layers. Problems regarding the use of low resistivity tungsten layers with tungsten nitride layers, however, have prevented these materials from being used together in semiconductor devices.

SUMMARY OF INVENTION

Ternary tungsten boride nitride (WBN) thin films and related methods of formation are provided. The films have excellent thermal stability, tunable resistivity and good adhesion to oxides. Methods of forming the films can involve thermal atomic layer deposition (ALD) processes in which boron-containing, nitrogen-containing and tungsten-containing reactants are sequentially pulsed into a reaction chamber to deposit the WBN films. In some embodiments, the processes include multiple cycles of boron-containing, nitrogen-containing and tungsten-containing reactant pulses, with each cycle including multiple boron-containing pulses.

BRIEF DESCRIPTION OF THE DRAWINGS

The following detailed description can be more fully understood when considered in conjunction with the drawings in which.

DETAILED DESCRIPTION

Introduction

Figure 1:
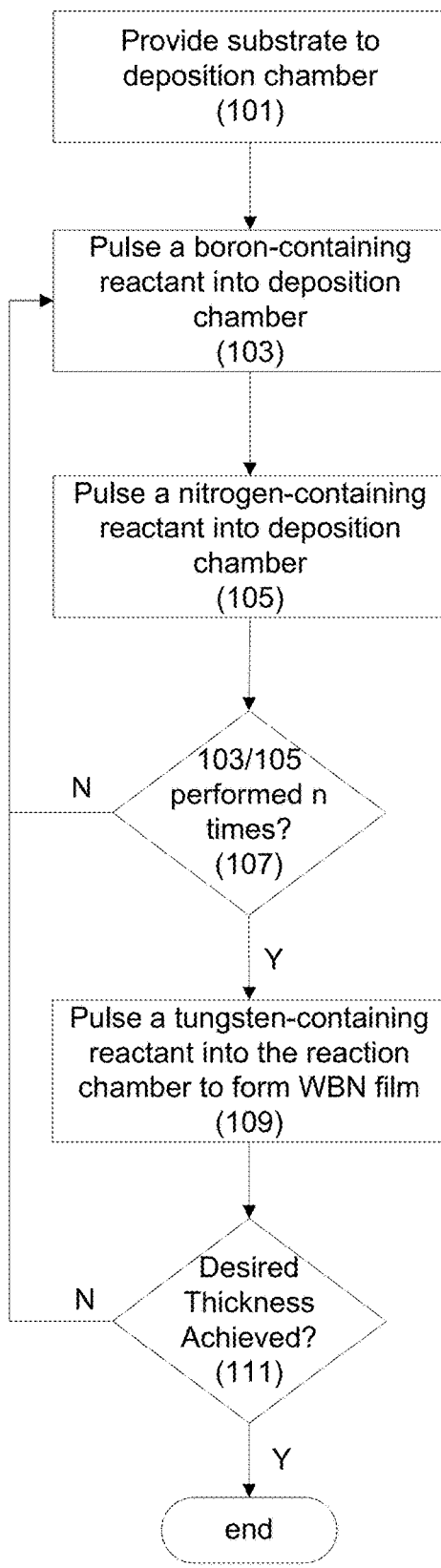
FIGS. 1-5 are process flow diagrams illustrating operations in examples of methods of depositing a ternary tungsten boride nitride (WBN) film.

In the following description, numerous specific details are set forth in order to provide a thorough understanding of the invention, which pertains to tungsten boride nitride films and methods of forming the same. Modifications, adaptations or variations of specific methods and of structures shown herein will be apparent to those skilled in the art and are within the scope of this invention.

Resistivity is an intrinsic property of a material and a measurement of a material's resistance to the movement of charge through the material. High or low resistivity materials can be used for different applications. For example, low resistivity metal layers in integrated circuits minimize power losses. High resistivity metal layers may be used as heater elements for phase change memory or other applications.

In one example, tungsten layers may be used as low resistivity electrical connections in the form of horizontal interconnects, vias between adjacent metal layers, and contacts between a first metal layer and the devices on the silicon substrate. Tungsten nitride layers may be used as diffusion barriers for tungsten interconnects, vias and plugs, providing relatively low resistivity and good adhesion to dielectric layers. Problems regarding the use of low resistivity tungsten layers with tungsten nitride layers, however, have prevented these materials from being used together in semiconductor devices.

Described herein are ternary tungsten boride nitride (WBN) thin films and related methods of formation. The films have excellent thermal stability, tunable resistivity and good adhesion to oxides. Methods of forming the films can involve thermal atomic layer deposition (ALD) processes in which boron-containing, nitrogen-containing and tungsten-containing reactants are sequentially pulsed into a reaction chamber to deposit the WBN films. In some embodiments, the processes include multiple cycles of boron-containing, nitrogen-containing and tungsten-containing reactant pulses, with each cycle including multiple boron-containing pulses. According to various embodiments, the WBN films can be barrier layers for tungsten interconnects and lines, thin film resistive heater elements for applications such as phase change memory or inkjet printers, and layers in a gate electrode stack.

In some embodiments, the methods described herein involve an atomic layer deposition (ALD) process. The process is repeated in a cyclical fashion until the desired thickness is achieved. ALD deposition, in general, is a method of sequentially depositing a plurality of atomic-scale layers on a wafer surface by sequentially injecting and removing reactants into and from a chamber. The reactants can be physically and/or chemically adsorbed onto the surface of a substrate in the chamber and/or react with a previously-adsorbed layer of one or more reactants. In embodiments described herein, pulses of reactants are sequentially injected into and purged from a reaction chamber to form a WBN thin film. As used herein, ALD broadly embodies any cyclical process of sequentially adding reactants for reaction on a substrate. In some embodiments, the ALD processes described herein are thermal ALD processes. Thermal ALD processes are non-plasma processes. In some cases, the activation energy for the surface reactions is provided solely via thermal energy. In some other instances, one or more forms of additional energy, e.g., UV radiation, may be used.

According to various embodiments, the methods involve multiple boron-containing reactant doses in each ALD process cycle to provide sufficient boron with which a tungsten containing precursor can react. In some embodiments, the methods involve multiple boron-containing and multiple nitrogen-containing reactant doses in each ALD process cycle. The W, B, and N ratios in the film can be modulated to achieve desired resistivity and other film characteristics. FIGS. 1-5 are process flow diagrams illustrating operations in examples of methods of depositing a ternary WBN film.

First turning to FIG. 1, the process begins by providing a substrate to a deposition chamber (101). The substrate can be a partially fabricated integrated circuit substrate, a phase change memory substrate, or any substrate on which a WBN film is desired. Examples of deposition chambers are described below with reference to FIGS. 9A and 9B. In general, the deposition chamber can include a substrate support, one or more gas inlets, and an exhaust. The process continues with pulsing a boron-containing reactant into the deposition chamber (103). The boron-containing reactant can be any process-compatible compound capable of effectively reducing a tungsten-containing reactant. The boron-containing reactant is typically a borane such as borane ($BH_3$), diborane ($B_2H_6$), triborane ($B_3H_7$), etc. In some embodiments, the dosage or pulse time of block 101 is relatively short, for example between 0.25 seconds and 1 second. (This range may be expanded depending on flow rate, pressure, substrate size, etc.) Example flow rates range from 50 sccm to 500 sccm for a 300 mm wafer. Example chamber pressure can range from 1 to 25 torr, with the partial pressure of the boron-containing reactant ranging from 1 mTorr to 1 Torr with Ar or other inert gas as a carrier gas. The boron-containing reactant (or a moiety thereof) is absorbed on the substrate surface.

Excess reactant and byproduct can be purged or evacuated from the deposition chamber after block 103. As described below, in some embodiments, a relatively long purge dose is performed after block 103. The process continues with pulsing a nitrogen-containing reactant into the deposition chamber (105). Examples of suitable nitrogen-containing reactants include $N_2$, $NH_3$, and $N_2H_4$. Without being by a particular reaction, at least some of the nitrogen-containing reactant may react with the adsorbed boron-containing reactant to form $B_xN$. Some amount of boron-containing reactant remains to react with a tungsten-containing reactant. In the case of using $NH_3$ or $N_2H_4$, higher order boranes $B_xH_y$ such as $B_6H_{10}$ that can react with the tungsten-containing reactant may be formed. Boron itself may also be available to react with the tungsten-containing reactant. Excess reactant and byproduct can be purged or evacuated from the deposition chamber after block 105. If an inert purge gas is used, example flow rates range from 5 slm to 100 slm, depending on the deposition chamber volume.

At block 107, if the blocks 103 and 105 have been performed n times, the process continues to block 109. If not, the process returns to block 103 with another pulse of a boron-containing reactant. The variable n is an integer greater than 1, and typically at least 3, though in some cases two repetitions of blocks 103 and 105 may suffice. Once blocks 103 and 105 have been performed n times, the process continues with pulsing a tungsten-containing reactant into the deposition chamber (109). Any process-compatible tungsten containing reactant may be used including $WF_6$, $WCl_6$, and $W(CO)_6$. In some embodiments, the tungsten-containing reactant can be an organo-tungsten precursor. Examples of organo-tungsten precursors include bis(alkylimino)bis(alkylamino) compound such as bis(tert-butylimino) bis(dimethylamino) tungsten. The tungsten-containing reactant is reduced, forming the ternary WBN film. Excess reactant and byproduct can be purged or evacuated from the deposition chamber after block 109. This completes one cycle of a multi-cycle deposition. If additional thickness is desired (block 111), the process returns to block 103, with the counter in block 107 typically reset to zero such that the next cycle also includes multiple sub-cycles of boron-containing/nitrogen-containing reactant pulses. The order of certain operations in FIG. 1 can be modified in some embodiments. For example, block 105 can be performed prior to block 103 in the blocks 103-107 sub-cycles. In some embodiments, block 109 can be performed prior to the blocks 103-107 sub-cycles.

Figure 2:
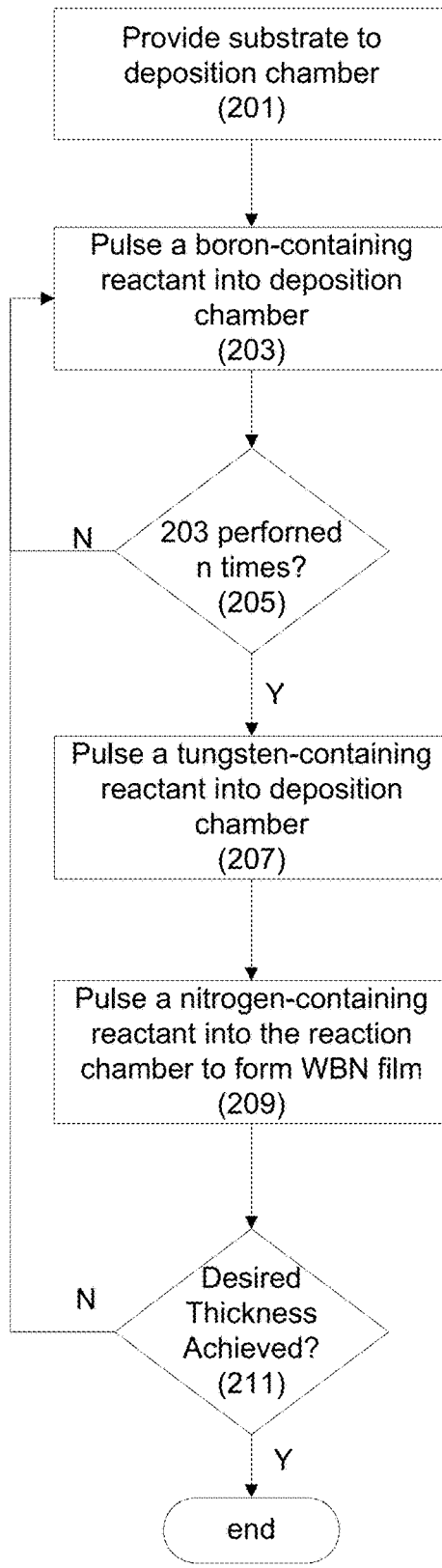

FIG. 2 shows another example of a process flow diagram illustrating operations in an example of a method of depositing a ternary WBN film. Like in FIG. 1, the process in FIG. 2 begins with providing a substrate to a deposition chamber (201). Block 201 is similar to block 101 described above. The process then continues with pulsing a boron-containing reactant into the deposition chamber (203). Examples of boron-containing reactants are given above. At block 205, if the block 203 has been performed n times, the process continues to block 207. If not, the process returns to block 203 with another pulse of a boron-containing reactant. The variable n is an integer greater than 1, and typically at least 3, though in some cases two repetitions of block 203 may suffice. The boron-containing reactant or a moiety thereof is absorbed onto the substrate. In some embodiments, the multiple boron-containing reactant pulses are separated by pulses of a purge gas. For example, excess reactant can be purged or evacuated from the deposition chamber after each performance of block 203, prior to block 205.

Once block 203 has been performed n times such that the substrate has been exposed to n pulses of the boron-containing reactant, the process continues with pulsing a tungsten-containing reactant into the deposition chamber (207). The tungsten-containing reactant is reduced by the adsorbed boron-containing reactant to form tungsten. Unlike reducing agent starved regimes used to form metallic tungsten or tungsten nitride films in which the reducing agent is substantially consumed in its entirety, boron remains in the film. Excess reactant and byproduct can be purged or evacuated from the deposition chamber after block 207. The process continues with pulsing a nitrogen-containing reactant into the deposition chamber to form the WBN film (209). This completes one cycle of a multi-cycle deposition. If additional thickness is desired (block 211), the process returns to block 203, with the counter in block 205 typically reset to zero such that the next cycle also includes multiple sub-cycles of boron-containing reactant pulses. The order of certain operations in FIG. 2 can be modified in some embodiments. For example, block 209 can be performed prior to block 209 in each cycle. In some embodiments, the block 203-205 sub-cycles can be performed between blocks 207 and 209.

Figure 3:
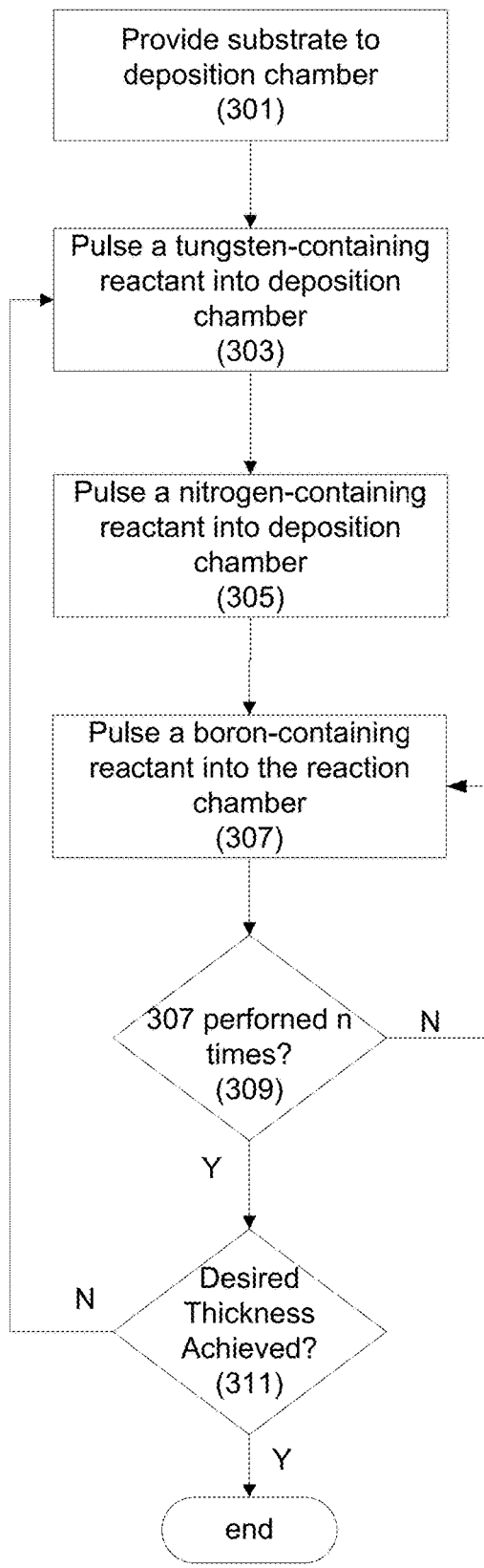

FIG. 3 shows another example of a process flow diagram illustrating operations in an example of a method of depositing a ternary WBN film. The process starts in the same fashion as those in FIGS. 1 and 2, with providing a substrate to a deposition chamber (301). The process continues with pulsing a tungsten-containing reactant into the deposition chamber (303). Examples of tungsten-containing reactants are given above. Excess reactant and byproduct can be purged or evacuated from the deposition chamber after block 303. The process continues with pulsing a nitrogen-containing reactant into the chamber (305) to introduce nitrogen into the film. Next, a boron-containing reactant is pulsed into the deposition chamber (307). At block 309, if the block 307 has been performed n times, the process continues to block 311 where another cycle can be performed. If not, the process returns to block 309 with another pulse of a boron-containing reactant. The variable n is an integer greater than 1, and typically at least 3, though in some cases two repetitions of block 309 may suffice. In some embodiments, the multiple boron-containing reactant pulses are separated by pulses of a purge gas. For example, excess reactant can be purged or evacuated from the deposition chamber after each performance of block 309. The boron-containing reactant reduces the tungsten-containing reactant to form tungsten, with at least some of the boron remaining incorporated in the film. The WBN film is formed by block 311. If additional thickness is desired (block 311), the process returns to block 303, with the counter in block 309 typically reset to zero such that the next cycle also includes multiple sub-cylces boron-containing reactant pulses. The order of certain operations in FIG. 3 can be modified in some embodiments. For example, block 305 can be performed prior to block 303 in each cycle.

Figure 4:
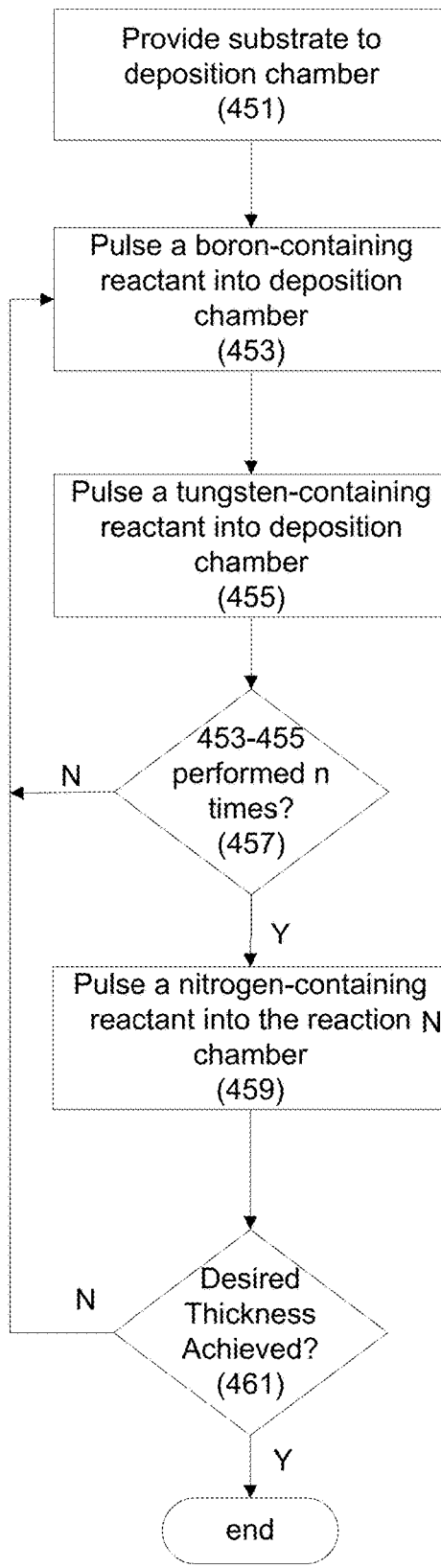

FIG. 4 shows another example of a process flow diagram illustrating operations in an example of a method of depositing a ternary WBN film. The process starts in the same fashion as those in FIGS. 1 to 3, with providing a substrate to a deposition chamber (451). The process continues with pulsing a boron-containing reactant into the deposition chamber (453). Examples of boron-containing reactants are given above. Excess reactant and byproduct can be purged or evacuated from the deposition chamber after block 453. The process continues with pulsing a tungsten-containing reactant into the chamber (455) to introduce tungsten into the film. At block 457, if the blocks 453 and 455 have been performed n times, the process continues to block 459, otherwise blocks 453 and 455 will be repeated. The variable n is an integer greater than 1, and typically at least 3, though in some cases two repetitions of blocks 453 and 455 may suffice. Next, a nitrogen-containing reactant is pulsed into the deposition chamber (459). The WBN film is formed by block 461. If additional thickness is desired (block 461), the process returns to block 453, with the counter in block 457 typically reset to zero such that the next cycle also includes multiple sub-cycles boron-containing and tungsten-containing reactant pulses.

Figure 5:
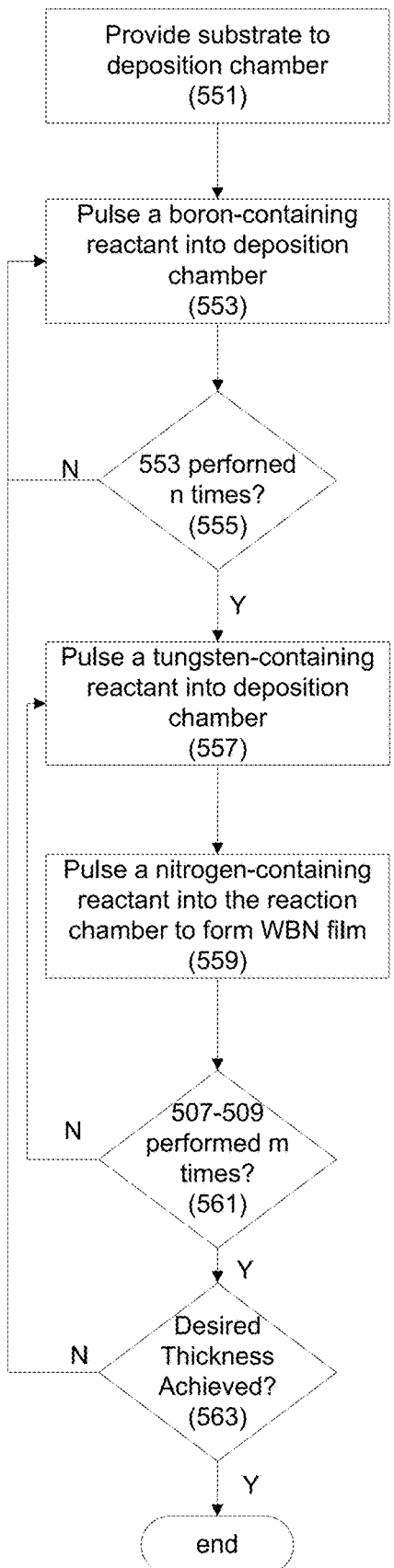

FIG. 5 shows another example of a process flow diagram illustrating operations in an example of a method of depositing a ternary WBN film. The process starts in the same fashion as those in FIGS. 1 to 4, with providing a substrate to a deposition chamber (551). The process continues with pulsing a boron-containing reactant into the deposition chamber (553). Excess reactant and byproduct can be purged or evacuated from the deposition chamber after block 553. At block 555, if the blocks 553 has been performed n times, the process continues to block 557, otherwise blocks 553 will be repeated. At block 557, the process continues with pulsing a tungsten-containing reactant into the chamber to introduce tungsten into the film, followed by block 559 where the process continues with pulsing a nitrogen-containing reactant into the chamber to introduce nitrogen into the film. At block 561, if the blocks 557 and 559 have been performed m times, the process continues to block 563, otherwise blocks 557 and 559 will be repeated. The variables n and m in FIG. 5 are integers greater than 1, and typically at least 2. The WBN film is formed by block 563. If additional thickness is desired (block 563), the process returns to block 553, with the counter in blocks 555 and 561 typically reset to zero such that the next cycle also includes multiple sub-cycles of reactant pulses.

The above-described processes involve exposing the substrate to more boron-containing reactant than tungsten-containing reactant to allow significant boron incorporation into the film. In some embodiments, this involves a ratio of the number of boron-containing reactant pulses to tungsten-containing reactant pulses of at least 2:1. The ratio can be at least 3:1, 4:1 or higher according to various embodiments. In the processes described herein, a pulse can be a single injection of gas or several short sequential injections. In some embodiments, the processes involve a ratio of the number of boron-containing reactant injections to tungsten-containing reactant injections of at least 2:1, 3:1 or higher.

In some embodiments, the relative flow rates of the pulses may also be varied to modulate the concentrations of W, B, and N. Example flow rates can range from about 60 sccm to about 300 sccm for a 300 mm wafer, with flow rates scaling linearly with area. Dosage times can also be varied, a greater number of short pulses of the boron-containing reactant provide more efficient boron incorporation than fewer, longer pulses. Moreover, in some embodiments, a relatively long purge time follows at least the pulses of the boron-containing reactant. In some embodiments, the purge time is at least about 5 times than that of the boron-containing reactant. In some embodiments, the purge time is at least about 10 times or even 15 times than that of the boron-containing reactant. For example, a purge of 7 seconds may follow a boron-containing reactant dose of 0.5 seconds. Without being bound by a particular theory, it is believed that it removing substantially all byproduct during the purge can significantly aid boron incorporation. Lower purge: boron-containing reactant dose time ratios may be used, for example, if the purge has substantially higher flow rates and pressures. WBN film fabrication can be performed within a wide range of temperatures. According to various embodiments, it can done at less than 300 C wafer temperature (e.g. 275 C), or up to >400 C temperature.

The relative amounts tungsten, boron and nitrogen in the WBN films, and thus their physical, electrical, and chemical characteristics can be efficiently tuned by varying the number of sub-cycles (i.e., the number n) in the processes described above. The process described in FIG. 1, in which each sub-cycle includes a nitrogen-containing reactant pulse as well as a boron-containing reactant pulse may be used to deposit high resistivity thin films, with the resistivity increasing with the amount of nitrogen present. Accordingly, the process described with reference to FIG. 1 can be used to modulate the amount of nitrogen, along with the amounts of tungsten and boron. In general, films deposited by the process described with reference to FIG. 1 will have more nitrogen than films deposited by the processes described with reference to FIGS. 2 and 3.

The films deposited by the processes described with reference to FIGS. 2 and 3 will be similar for similar process conditions, dosage amounts and times, etc. However, in some cases, it may be advantageous to expose the substrate to the tungsten-containing reactant prior to the other reactants (as shown in FIG. 3) and vice versa. In particular, it has been found that for deposition on TEOS oxide, better adhesion results if the substrate is exposed to the tungsten-containing reactant as illustrated in FIG. 3. TEOS oxide is silicon dioxide formed from tetraethylorthosilicate $Si(OC_2H_5)_4$, which decomposes to form $SiO_2$. The process shown in FIG. 3 would be similarly advantageous to use for other silicon dioxide films. For deposition on $SiO_2$ films in which nitrogen level modulation is desired, the process shown in FIG. 1 can be modified such that block 109 occurs prior to blocks 103-107 to expose the films to the tungsten-containing reactant first. For deposition on low-k oxides, such as carbon-doped oxides, gate oxides, nickel, nickel silicides, other metal silicides, and silicon, in which the tungsten-containing reactant includes fluorine, or another other halogen or highly reactive moiety, it may be preferable to expose the film to the boron-containing reactant first to prevent possible damage from attack. The WBN films are amorphous and according to various embodiments may have the following atomic percentages: W: about 5% to about 70%; B: about 5% to about 60%; and N about 20% to about 80%. In some embodiments, the WBN films have the following atomic percentages: W about 15% to about 50%; B: about 15% to about 50%; and N about 20% to about 50%. Other impurities may also be present in amounts less than 1% atomic. Resistivity increases with decreasing tungsten and increasing nitrogen concentrations. Thermal stability and adhesion to oxide can be increased with the addition of boron.

Applications

Below are descriptions of various example applications of the ternary WBN films. Note that these descriptions are presented only as examples. They are not meant to exclude other applications nor are they meant to exclude the use of the invention from variations or combinations of methods described.

Figure 6:
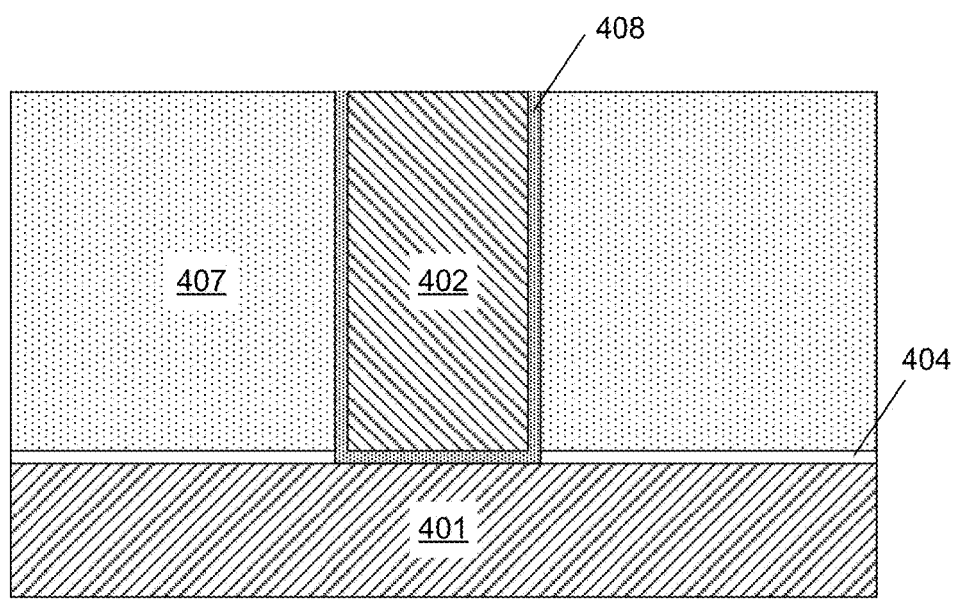
FIG. 6 is a schematic cross-sectional representation of an example of a ternary WBN diffusion barrier/W via stack.

The thermal ALD WBN deposition methods can be used in processes for generating tungsten plugs for contact or via fill in IC wafer fabrication. The WBN layer serves as a diffusion barrier for the tungsten contact, and can also serve as a liner or adhesion layer. The WBN barrier and/or adhesion layer for direct tungsten plugfill contacts tungsten, metal silicides (such as $TiSi_x$, $CoSi_x$, $NiSi_x$, or $WSi_x$), silicon (N+ or P+), or other electrically conductive materials. Because WBN film fabrication can be performed at low wafer temperature (e.g. 275 C), it can also be used in some special applications, for example, magnetoresistive random access memory (MRAM), where low process temperature is required to avoid device degradation or functional materials damage. FIG. 6 shows a schematic example of a ternary WBN diffusion barrier 408 between a copper interconnect 401 and a tungsten via 402. A silicon nitride copper capping layer 404 is also shown. The WBN diffusion barrier layer 408 has good adhesion to oxide 407.

In some embodiments, the WBN layer can be part of an integrated contact plug film stack including WBN (barrier-adhesion layer)/pulsed nucleation layer W (PNL-W) (nucleation layer)/CVD-W (primary conductor and bulk plugfill). PNL-W nucleation layers are described in U.S. Pat. Nos. 7,005,372; 7,262,125; 7,589,017; 7,772,114; and 8,058,170, which are incorporated by reference herein.

Figure 7:
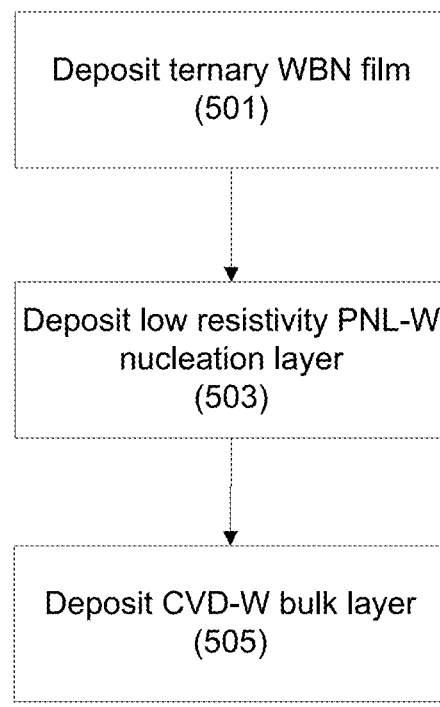
FIG. 7 is process flow diagram illustrating operations in an example of a method of depositing a ternary tungsten boride nitride/tungsten (WBN/W) stack.

FIG. 7 shows an example of a process flow diagram illustrating operations in an example of a method of forming an integrated plug fill stack. A ternary WBN layer is deposited as described above with respect to FIGS. 1-5 (501). In some examples, the number of sub-cycles (n) is between about 3 and 5, e.g., 3. According to various embodiments, WBN layer between about 20 Å to 100 Å thick is deposited. A low-resistivity tungsten layer is deposited on the WBN layer (503). A tungsten nucleation layer is a thin conformal layer that facilitates growth of bulk tungsten. Tungsten nucleation layers typically have higher electrical resistivities than tungsten bulk layers. To keep the resistivity of the tungsten layer (i.e., tungsten nucleation layer and tungsten bulk layer) low, the tungsten nucleation layer is generally kept as thin as possible. Tungsten nucleation layer thicknesses typically range from 5 Å to 50 Å.

In the example depicted in FIG. 5, the tungsten nucleation layer is deposited with a PNL technique. In a PNL deposition process, pulses of reducing agent, purge gases and tungsten-containing precursors are sequentially injected into and purged from the reaction chamber, as described above with respect to forming a tungsten layer. The process is repeated in a cyclical fashion until the desired nucleation layer thickness is achieved. (It should be noted that the WBN film deposition techniques described herein may be considered to be PNL processes and referred to as PNL-WBN).

Additional discussion regarding PNL type processes to deposit tungsten nucleation layers can be found in above-referenced U.S. Pat. No. 7,589,017, which describes depositing PNL-W nucleation layers at relatively low temperatures, e.g., 300° C. After deposition, the tungsten nucleation layer can be treated to lower its resistivity. Possible treatments include exposure of the tungsten nucleation layer to pulses of reducing agent, such as a silane or a borane (e.g., diborane), or a high temperature treatment. Low resistivity treatments are described in above-referenced U.S. Pat. Nos. 7,589,017; 7,772,114; and 8,058,170 and in U.S. patent application Ser. No. 12/755,248, which is incorporated by reference herein.

After the desired tungsten nucleation layer thickness is attained and treated, bulk tungsten is deposited on the nucleation layer with CVD (505). Any suitable CVD process with any suitable tungsten-containing precursor may be used. In certain embodiments the tungsten precursor is one of $WF_6$, $WCl_6$ and $W(CO)_6$. Frequently, the CVD process is performed using a mixture of molecular hydrogen and one or more of these precursors. In other embodiments, the CVD process may employ a tungsten precursor together with silane, a mixture of hydrogen and silane, or a mixture of hydrogen and borane (such as diborane). Non-CVD process can also be employed to form the tungsten bulk layer. These include ALD, PNL, or PVD. The resistivity of a tungsten layer (i.e., tungsten nucleation layer and tungsten bulk layer) deposited with the low-resistivity tungsten process is from about 10 μΩ-cm to about 30 μΩ-cm, but the resistivity does depend on the thickness of the layer.

The tungsten bulk layer can be deposited to any thickness. Tungsten interconnect lines for integrated circuit applications may have a total thickness (tungsten nucleation layer and tungsten bulk layer) of between about 20 Å and 1,000 Å. For a typical bit line, the total tungsten layer thickness is typically no greater than about 500 Å.

Conventional film stacks for tungsten vias and contacts include Ti/TiN/W nucleation/CVD-W. The ternary WBN films can be used to simplify this stack to WBN/PNL-W (nucleation)/CVD-W as described with reference to FIG. 7. Advantages to replacing Ti/TiN include the 1) the ability to fill contacts and vias with aspect ratios greater than 20:1, 2) elimination of Ti—TiN deposition equipment and processing steps, including PVD-Ti, 3) reduction in semiconductor wafer maximum processing temperature requirements, 4) reduction in post-CMP center seam opening (or coring) of tungsten plugs, and depositing thinner layers, lowering resistance.

Moreover, WBN/low resistivity W may have advantages over WN/low resistivity tungsten. Low resistivity tungsten can achieve low resistivity by increasing W grain size. However, increasing grain size can require stronger adhesion between the barrier layer and the oxide layer to undergo CMP without coring, opening, or detachment of the barrier layer from the oxide. Low resistivity nucleation processes that use boron-containing reducing agents (e.g., as described in the above-referenced patents and patent application) on WN barrier layers have adhesion problems. As described further below, the ternary WBN films described herein show improved adhesion to oxide over thermal ALD WN film.

WBN can be formed in the vias or contact holes directly on the dielectric or with a PNL-W seed layer. The tungsten bulk layer may be deposited by PNL, ALD, CVD, or a combination of these. Also, the process may be integrated with a degas and/or preclean operation (e.g., a plasma etch) prior to the WBN deposition. In some cases it may be advantageous to create a combined TiN/WBN barrier layer.

The reactor employed for this application may support single-wafer processing or multi-station sequential deposition, with WBN and tungsten CVD integrated in a single module. In some implementations wafer pre-heat, preclean, and WBN deposition are combined in a one multi-station process module and a second process module is dedicated to the deposition of PNL-W and CVD-W. In some situations wafer preheat/degas, and wafer preclean may each be given independent process modules on an integrated cluster tool to provide greater process flexibility.

Example process flows include the following:
1. WBN-PNLW nucleation layer-CVD-W bulk plugfill
2. PNL-W seed/WBN liner barrier/PNL-W nucleation/CVD-W bulk plugfill
3. preheat/wafer preclean/PNL-W seed/WBN liner barrier/PNL-W nucleation/CVD-W plugfill
4. WBN liner barrier-CVD-W plugfill
5. WBN-W integrated with degas, preclean (DFE or reactive clean)
6. WBN-W integrated with degas, preclean (DFE or reactive clean) and HCM-Ti (a thin titanium layer deposited via a hollow cathode magnetron).

Note that "DFE" is Dual Frequency Etch. As an example, NOVA wafer preclean manufactured by Lam Research® Corporation uses Ar ions from a dual frequency inductive plasma to provide high plasma density (low frequency component) and independently controllable ion acceleration (high frequency component).

In another application, the ternary WBN films described herein can be used as a metal electrode either alone or in a WBN/W film stack. More generally, the WBN layer can function as an adhesion layer, barrier layer, and/or as a primary electrical conductor for a top or bottom capacitor electrode. High electrode work functions are known to reduce leakage in memory cell capacitors. In the methods described herein, N level and thus work function can be tuned as described above. The tungsten may be deposited by PNL, ALD, CVD, or a combination thereof. Degas and/or preclean may be employed. And single wafer processing or multi-station sequential deposition may be employed.

Note that integrated circuit capacitor electrodes are currently made from film stack of CVD-TiN and highly doped polysilicon. The deposition temperatures for TiCl$_4$-based CVD-TiN and poly silicon are >550 C and >600 C, respectively. These high temperatures result in the driving of impurities into the capacitor dielectric (e.g. Cl) and the oxidation of the TiN barrier layer, both of which reduce capacitance and increase capacitor leakage. A WBN-W capacitor electrode can dramatically reduce the manufacturing thermal cycles with resulting leakage reductions and improvements or post anneal capacitance for comparable leakage. The following process flows can be used to deposit top or bottom capacitor electrodes.

1) WBN/PNLW nucleation layer/CVD-W
2) WBN/PNL-W/CVD-W
3) WBN-CVD-W plugfill
4) WBN-W integrated with degas, preclean (DFE or reactive clean)

The capacitors may be trench capacitors, fin capacitors, plate capacitors or any other structure suitable for IC applications. In the case of stacked capacitors the bottom electrode may be deposited on a polysilicon bottom electrode to facilitate structure formation. The extremely high step coverage of the ternary WBN and PNL-W are enabling features required for implementation of WBN for modern semiconductor memory cell electrodes.

In another example application, WBN functions as an adhesion layer, barrier layer, or primary conductor in a gate electrode. WBN may be applied directly on the gate dielectric or on a polysilicon electrode to reduce polysilicon line thickness requirements.

Some characteristics for a transistor gate application include a tunable work function, thermal stability, and resistance to oxidation. Modifying the WBN stoichiometry of the as-deposited film can tune the work function of the WBN film. As a gate electrode, a WBN or WBN/W film stack provides a metal gate that resists the charge depletion phenomenon commonly observed in non-metallic gate electrodes such as those fabricated from polysilicon. Charge depletion effectively increases the gate dielectric thickness. A W/WBN gate electrode may also be formed on top of a polysilicon gate electrode to reduce the height requirement of the polysilicon gate without changing the gate dielectric/polysilicon interface.

As discussed above, it may be valuable to fabricate layered PNL-W/PNL-WN gate electrode structures to facilitate work function modulations for mixed N+ and P+ transistor devices.

Various possible process flow implementations include
1) WBN-PNL-W-CVD-W bulk deposition and interconnect
2) Layered PNL-W/WBN/CVD-W bulk deposition and interconnect
3) WBN/PNL-W gate electrode with poly-Si plug and interconnect
4) WBN/PNL-W/CVD-W on a thin poly-Si gate electrode for reduced poly-Si thickness requirement.
5) WBN-CVD-W plugfill.

Tool configuration options include
1) WBN-W integrated with degas, preclean (DFE or reactive clean) and
2) single-wafer processing or multi-station sequential deposition with WBN, PNL and WCVD integrated in a single module.

Figure 8:
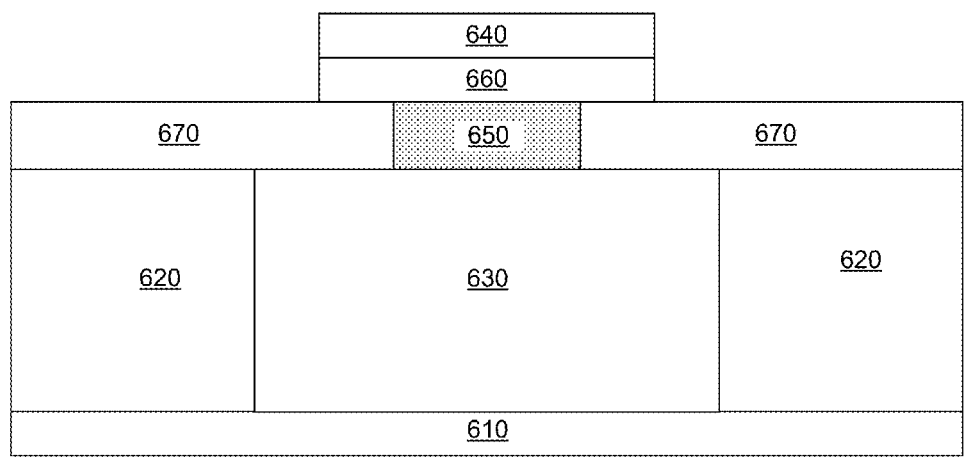
FIG. 8 is a schematic cross-sectional representation of an example of a phase change memory cell including a ternary WBN heater element.

In another example application, the ternary WBN films described herein can be used as resistive elements. One application of resistive heating elements is in a phase change memory cell, an example of which is shown in FIG. 8. The cell includes a conductive layer 610, a lower electrode 630, a phase change material 660, a second electrode 640, and a heater element 650. Lower electrode 630 is in a first dielectric layer 620, and ternary WBN film element 650 is in a second dielectric layer 670. The cell may be formed on a semiconductor substrate.

Phase change material 660 is typically a chalcogenide glass material, though other materials that are capable of changing from a crystalline to an amorphous state or vice versa upon application or withdrawal of heat may also be used. Because the electrical resistivity of the amorphous state of the chalcogenide material is significantly higher than the crystalline state, the phase change material can be used to store data. The amorphous, highly resistive state is used to represent one bit value (0 or 6) with the crystalline, low resistive state used to represent the other bit value.

Conductive layer 610 may be an address line, e.g., a column line, row line, bit line or word line, used to program or read information stored using the phase change material. The conductive layer may be connected to external addressing circuitry.

The electrodes are made of electrically conductive materials. In the example shown in FIG. 8, the lower electrode 630 is a plug, e.g., a tungsten plug. The first dielectric layer 620 may be silicon oxide, silicon nitride or any other type of electrically insulating material. Second dielectric material 670 is electrically and thermally insulating may be made of the same or different material as dielectric layer 620.

The ternary WBN heater element 650 is generates heat in response to the electrical current passing through the adjacent electrode, lower electrode 630. The resistivity of ternary WBN heater element 650 is high relative to that of electrode 630 to generate heat from the current. In operation a current or voltage pulse is applied to the heater element to generate heat. The heat generated by the heater element heats the phase-change material to a temperature above its crystallization temperature and below its melting temperature to achieve a crystalline state, which typically represents a bit value of 6. To change the phase change material back to its amorphous state, the heater element heats the material above its melting point. The phase change material is then quenched to achieve an amorphous state, which typically represents a bit value of 0. The ternary WBN films can have high resistivity (e.g., around 5000 $\mu\Omega$-cm for a 50-60 angstrom film) and are stable on anneal to 900° C. and have electric contact to the underlying surface (e.g., the tungsten plug electrode in FIG. 8). As described further below, the WBN films have better thermal stability on anneal as compared to binary WN films.

Other applications including a barrier and adhesion layer for the deposition of bitline or wordline local interconnects in DRAM devices. In another application the WBN film can serve as an adhesion layer for W deposition on oxide in semiconductor applications such as light shield for CCD devices.

Apparatus

Figure 9A:
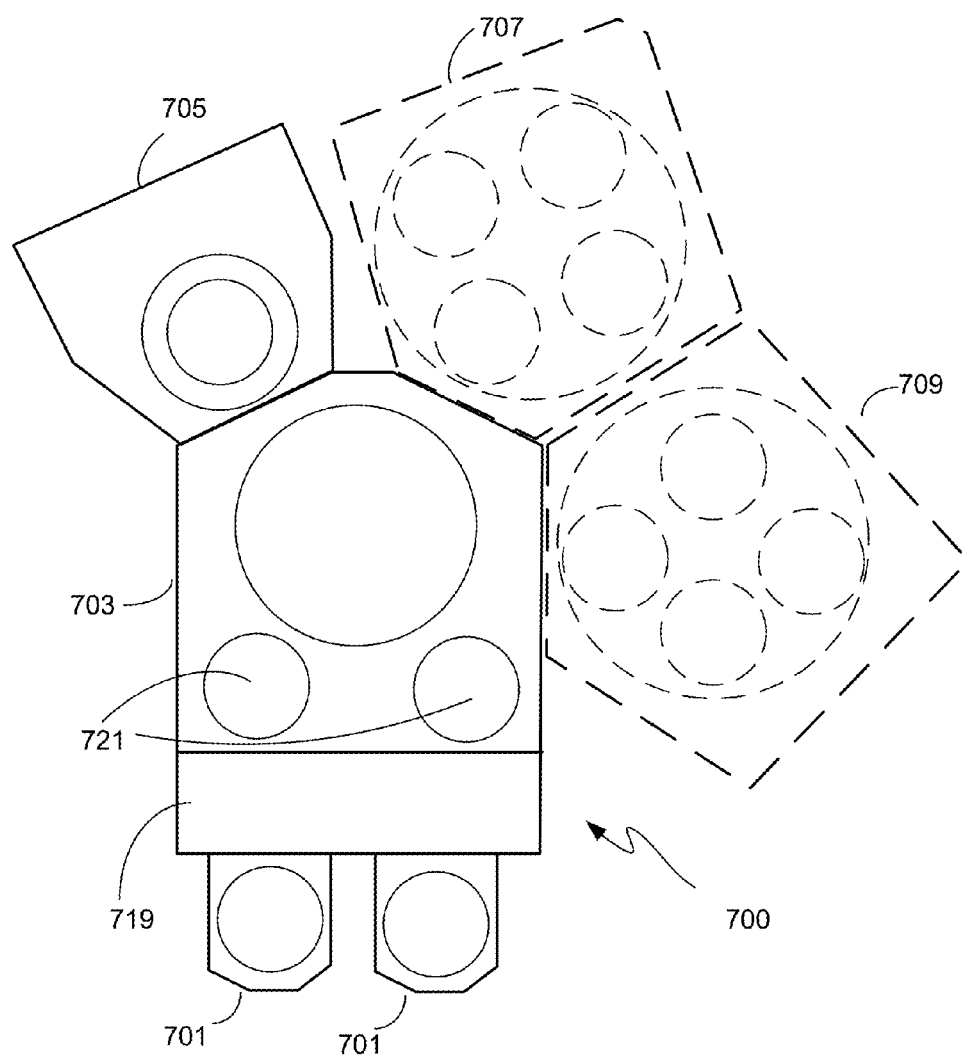
FIGS. 9A and 9B are schematic illustrations showing apparatus suitable for performing the methods described herein.
Figure 9B:
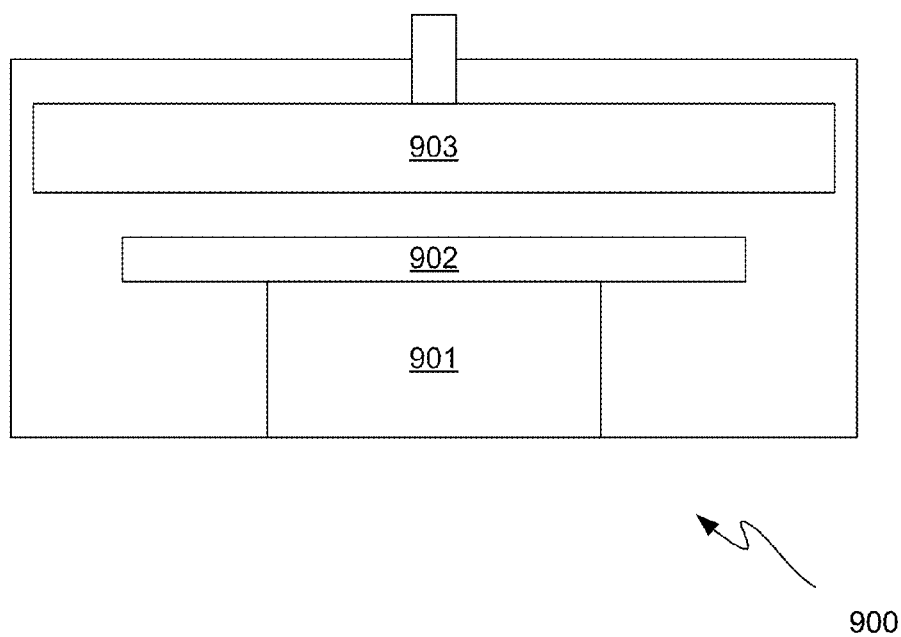

FIG. 9A is a block diagram of a processing system suitable for conducting tungsten thin film deposition processes in accordance with embodiments of the invention. The system 700 includes a transfer module 703. The transfer module 703 provides a clean, pressurized environment to minimize the risk of contamination of substrates being processed as they are moved between the various reactor modules. Mounted on the transfer module 703 are multi-station reactors 707 and 709, each of which may be capable of performing PNL deposition and/or CVD according to embodiments of the invention. For example, chamber 707 may be configured to perform PNL deposition of tungsten boride nitride as described herein. According to various embodiments, a wafer may be transferred from station to station in WBN deposition or may remain in one station with WBN depositions occurring in parallel. Further, WBN deposition may occur in a single station chamber. Chamber 709 could be configured such that one station performs PNL deposition of a nucleation layer, one stage performs a multi-pulse reducing agent treatment, and two stations perform CVD. Each deposition station can include a heated wafer pedestal and a showerhead, dispersion plate, or other gas inlet. An example of a deposition station 900 is depicted in FIG. 9B, including a wafer support 902 and a showerhead 903. A heater may be provided in a pedestal portion 901.

Also mounted on the transfer module 703 may be one or more single or multi-station modules 705 capable of performing plasma or chemical (non-plasma) pre-cleans. The module may also be used for various other treatments, e.g., post-deposition nitriding treatments. The system 700 also includes one or more (in this case two) wafer source modules 701 where wafers are stored before and after processing. An atmospheric robot (not shown) in the atmospheric transfer chamber 719 first removes wafers from the source modules 701 to loadlocks 721. A wafer transfer device (generally a robot arm unit) in the transfer module 703 moves the wafers from loadlocks 721 to and among the modules mounted on the transfer module 703.

In certain embodiments, a system controller 750 is employed to control process conditions during deposition. The controller will typically include one or more memory devices and one or more processors. The processor may include a CPU or computer, analog and/or digital input/output connections, stepper motor controller boards, etc.

The controller may control all of the activities of the deposition apparatus. The system controller executes system control software including sets of instructions for controlling the timing, mixture of gases, chamber pressure, chamber temperature, wafer temperature, RF power levels, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions.

The foregoing describes implementation of embodiments of the invention in a single or multi-chamber semiconductor processing tool.

EXPERIMENTAL

Figure 10:
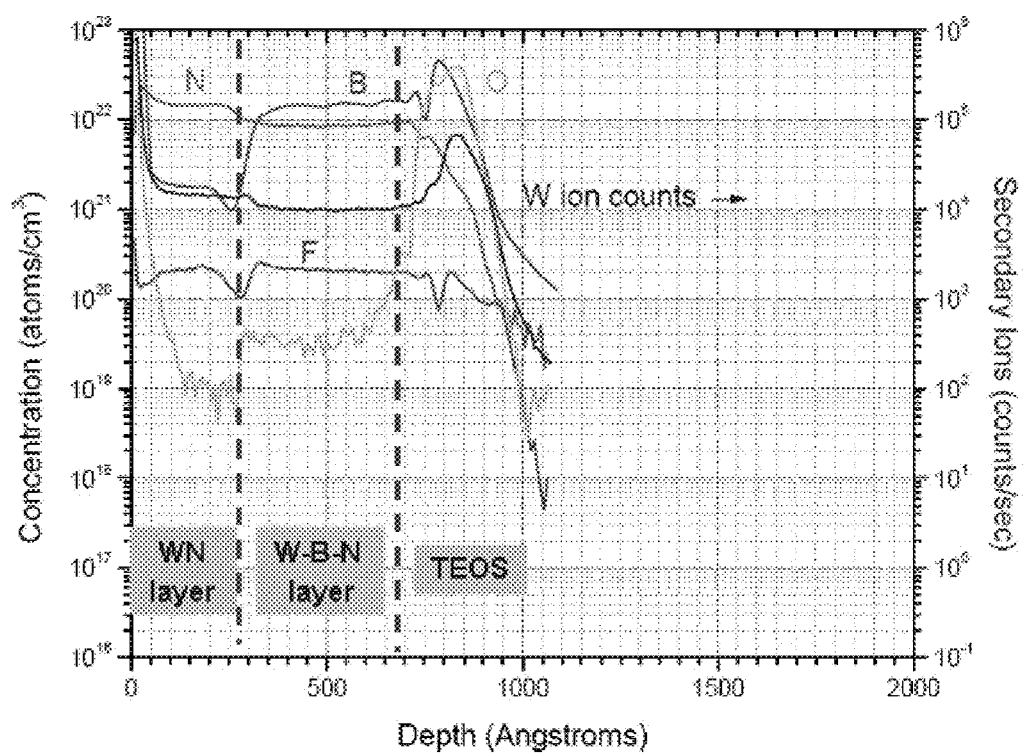
FIG. 10 is a graph showing atomic concentrations of WN and WBN layers.

FIG. 10 shows results of a secondary ion mass spectrometry (SIMS) analysis of a WBN film deposited using a multi-cycle ALD process, each cycle having the following sequence: 3 pulses $(B_2H_6) \rightarrow 1$ pulse $NH_3 \rightarrow 1$ $WF_6$ pulse. Purge gas was pulsed used between reactant pulses. In particular, $B_2H_6$ pulses were 0.5 seconds followed by 7 second purge. 200 Å of the WBN film were deposited on TEOS film, and a 200 Å WN film was deposited on WBN film. Flow rates were 190 sccm $B_2H_6$, 290 sccm $NH_3$, 250 sccm $WF_6$. As shown in FIG. 10, using three pulses of the boron-containing reactant per ALD cycle resulted in significant boron incorporation in the WBN film, with the film being about 30% W, 40% B and 30% N. The total amounts of W and N in the WBN film are similar to that in a WN film obtained using a 1 pulse $B_2H_6 \rightarrow 1$ pulse $WF_6 \rightarrow 1$ $NH_3$ pulse, in which almost no boron is incorporated (<1%). X-ray photoelectron spectroscopy (XPS) analysis showed the film contains both W—B and W—N bonds. Resistivity of the WBN film was measured and is similar to that of a WN film at 60 Å.

Thermal stability of the WBN film is also improved over WN films. Table 1 below shows atomic concentration of the WBN films after two 30 minute anneals at 850° C. A normal WN film (e.g., about 50% W, 50% N) would become almost pure W after being annealed at these conditions.

TABLE 1

WBN film composition pre- and post-thermal annealing

|  | W | B | N | Density (at/cc) |
|---|---|---|---|---|
| Pre-anneal | 29.3 | 43.1 | 27.6 | 1.16E+23 |
| Post-anneal | 44.6 | 29.6 | 24.8 | 1.05E+23 |

Unlike with WN films, which are subject to nitrogen loss at temperatures greater than about 700° C., almost no N loss is observed after 1 hour of high temperature anneal in the WBN films. Thermal stability is an important characteristic for barrier films.

A 4-point bend analysis of a 60 Å WBN film shows improved adhesion to oxide over WN film. TEOS oxide was deposited on a silicon substrate. A 60 Å WBN film/1500 Å low resistivity W film stack was deposited on the TEOS, using the following process:

60 Å WBN: multiple cycles $3 \times (B_2H_6) \rightarrow NH_3 \rightarrow WF_6$ pulse. $B_2H_6$ pulses were 0.5 seconds followed by 7 second purge.

Low resistivity W nucleation: multiple cycles of $(B_2H_6 \rightarrow WF_6)$ in $H_2$-free ambient at 300° C., followed by CVD W deposition.

An epoxy layer was applied on the W and a cut was made in the WBN/W stack, with a four point bend applied. The failing interface was observed between the tungsten and the epoxy, with the WBN film remaining adhered to the oxide. WN films tend to delaminate on oxide in a similar 4 point bend test.

Chemical mechanical planarization (CMP) was performed on WBN/W vias in oxide filled by the same method described above. A SEM top view of the vias after CMP showed 1) the features remain filled indicating no tungsten pulled out, and 2) no contrast due to a recessed WBN barrier film. This also is an improvement over WN/W vias that show defects after CMP.

Without being bound by a particular theory, it is believed that the good adhesion of WBN on oxide may be due to 1) multiple boron pulses and high temperature allow strong B—O bond formation at the oxide/WBN interface; and (2) the good barrier property of WBN films effectively prevents fluorine or other impurities from the CVD W process diffuse into the oxide interface and affect adhesion. However, as described above the method described in FIG. 3 in which the tungsten-containing reactant is flowed before the boron-containing reactant has been shown to provide good adhesion to silicon dioxides such as TEOS oxide.

As indicated above, the level of N in the film and thus the resistivity can be modulated. Table 2 below shows resistivity of ternary WBN films deposited on 5 k Å TEOS oxide using multiple cycles of an $n(B_2H_6 \rightarrow 1 \ NH_3) \rightarrow WF_6$ process sequence as described above with reference to FIG. 1, for various values of n.

TABLE 2

Modulating N level and resistivity

| n, number of $B_2H_6 \rightarrow NH_3$ sub-cycles per ALD cycle | XRF thickness of WBN film, Å | Resistivity, $\mu\Omega$-cm |
|---|---|---|
| 1 | 85.4 | 446.5 |
| 2 | 86.8 | 708.2 |
| 3 | 85.4 | 1010.2 |
| 4 | 78.0 | 2022.9 |
| 5 | 67.8 | 6382.9 |

Table 2 shows that the resistivity can be modified by changing the number of $B_2H_6 \rightarrow 1$ $NH_3$ sub-cycles. Higher resistivity indicates a greater nitrogen level within the ternary WBN film. Moreover, the work function of the film can be modified by appropriately tuning the nitrogen level.

The apparatus/processes described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step enabled with a number of possible tools: (1) application of photoresist on a work piece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper.

There are many alternative ways of implementing the methods and apparatus of the disclosed embodiments. It is therefore intended that the following appended claims be interpreted as including all such alterations, modifications, permutations, and substitute equivalents as fall within the true spirit and scope of the disclosed embodiments.

The invention claimed is:

1. A method comprising:
performing multiple cycles of sequentially introducing pulses of a boron-containing reactant, a nitrogen-containing reactant and a tungsten-containing reactant into a reaction chamber containing a semiconductor substrate to thereby deposit a ternary tungsten boride nitride film on the substrate, wherein the ternary tungsten boride nitride film contains tungsten-boron bonds and tungsten-nitrogen bonds, wherein a ratio of the number of boron-containing reactant pulses to the number of tungsten-containing reactant pulses introduced during the multiple cycles is at least three, and wherein the boron-containing reactant reduces the tungsten-containing reactant to form tungsten and provides boron to form the ternary tungsten boride nitride film.

2. The method of claim 1, wherein each cycle comprises multiple sequential sub-cycles of alternating boron-containing reactant and nitrogen-containing reactant pulses without any intervening tungsten-containing reactant pulses.

3. The method of claim 1, wherein each cycle comprises multiple sequential boron-containing reactant pulses without any intervening nitrogen-containing reactant pulses or tungsten-containing reactant pulses.

4. The method of claim 1, wherein the substrate is exposed to a boron-containing pulse prior to being exposed to any tungsten-containing reactant pulses.

5. The method of claim 1, wherein the substrate is exposed to a tungsten-containing reactant pulses prior to being exposed to any boron-containing reactant pulses and nitrogen-containing reactant pulses.

6. The method of claim 1, wherein the ternary tungsten boride nitride film is deposited on an oxide.

7. The method of claim 1, wherein each cycle includes a purge gas pulse between any two sequential boron-containing reactant pulses.

8. The method of claim 7, wherein a boron-containing reactant pulse has a first duration and a purge gas pulse that directly follows the boron-containing reactant pulses has a second duration, and the ratio of the second duration to the first duration is at least about 5.

9. The method of claim 8, wherein the ratio is at least about 10.

10. The method of claim 1, wherein the atomic percent of tungsten in the ternary tungsten boride nitride film is between about 5% and 70%, wherein the atomic percent of boron in the ternary tungsten boride nitride film is between about 5% and 60%, and the atomic percentage of nitrogen in the ternary tungsten boride nitride film is between about 20% and 80%.

11. The method of claim 1, further comprising annealing the ternary tungsten boride nitride film at a temperature of at least about to 750° C.

12. The method of claim 1, further comprising depositing a tungsten nucleation layer on the ternary tungsten boride nitride film.

13. The method of claim 12, wherein the tungsten nucleation layer is deposited by introducing alternating boron-containing reactant pulses and tungsten-containing reactant pulses to a chamber containing the substrate.

14. The method of claim 13, wherein the tungsten nucleation layer is deposited at a temperature between about 250° C. and 350° C.

15. The method of claim 1, wherein the ternary tungsten boride nitride film is amorphous.

* * * * *